(12) United States Patent
Xie et al.

(10) Patent No.: US 9,178,036 B1
(45) Date of Patent: Nov. 3, 2015

(54) METHODS OF FORMING TRANSISTOR DEVICES WITH DIFFERENT THRESHOLD VOLTAGES AND THE RESULTING PRODUCTS

(71) Applicant: GLOBALFOUNDRIES Inc., Grand Cayman (KY)

(72) Inventors: Ruilong Xie, Niskayuna, NY (US); Naim Moumen, Clifton Park, NY (US); Chanro Park, Clifton Park, NY (US); Hoon Kim, Clifton Park, NY (US); Steven Bentley, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/492,629

(22) Filed: Sep. 22, 2014

(51) Int. Cl.
H01L 21/336 (2006.01)
H01L 27/092 (2006.01)
H01L 29/66 (2006.01)
H01L 21/28 (2006.01)

(52) U.S. Cl.
CPC ...... *H01L 29/66545* (2013.01); *H01L 27/0922* (2013.01); *H01L 21/28185* (2013.01)

(58) Field of Classification Search
CPC .............. H01L 21/28185; H01L 27/0922; H01L 29/66545
USPC ............................................... 257/321
See application file for complete search history.

(56) References Cited

U.S. PATENT DOCUMENTS

| 2005/0148127 A1* | 7/2005 | Jung et al. ............. 438/197 |
| 2010/0176424 A1 | 7/2010 | Yeo et al. |

* cited by examiner

*Primary Examiner* — Daniel Shook
(74) *Attorney, Agent, or Firm* — Amerson Law Firm, PLLC

(57) ABSTRACT

One illustrative method disclosed herein includes, among other things, performing at least one recess etching process such that a first portion of a high-k oxide gate insulation layer and a first portion of a metal oxide layer is positioned entirely within a first gate cavity and a second portion of the high-k oxide gate insulation layer, a conformal patterned masking layer and a second portion of the metal oxide layer is positioned entirely within a second gate cavity, performing at least one heating process to form a composite metal-high-k oxide alloy gate insulation layer in the first gate cavity, while preventing metal from the metal oxide material from being driven into the second portion of the high-k oxide gate insulation layer in the second gate cavity during the at least one heating process, and forming gate electrode structures in the gate cavities.

29 Claims, 8 Drawing Sheets

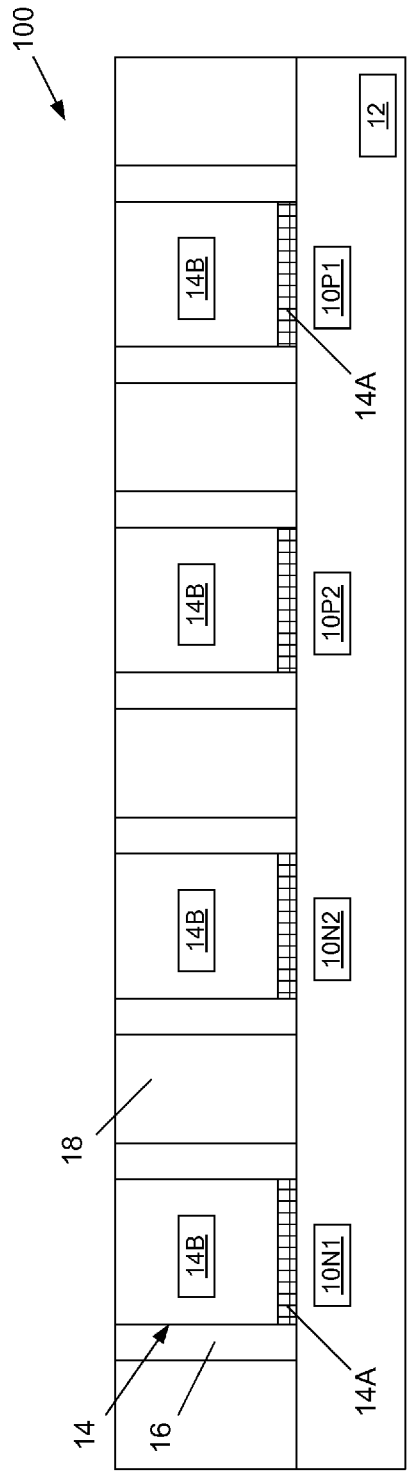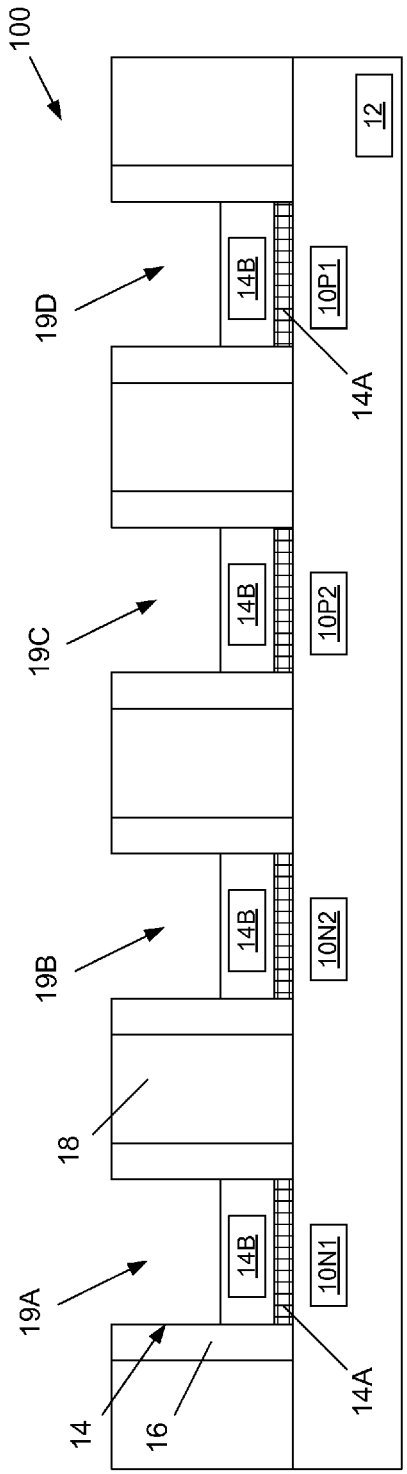

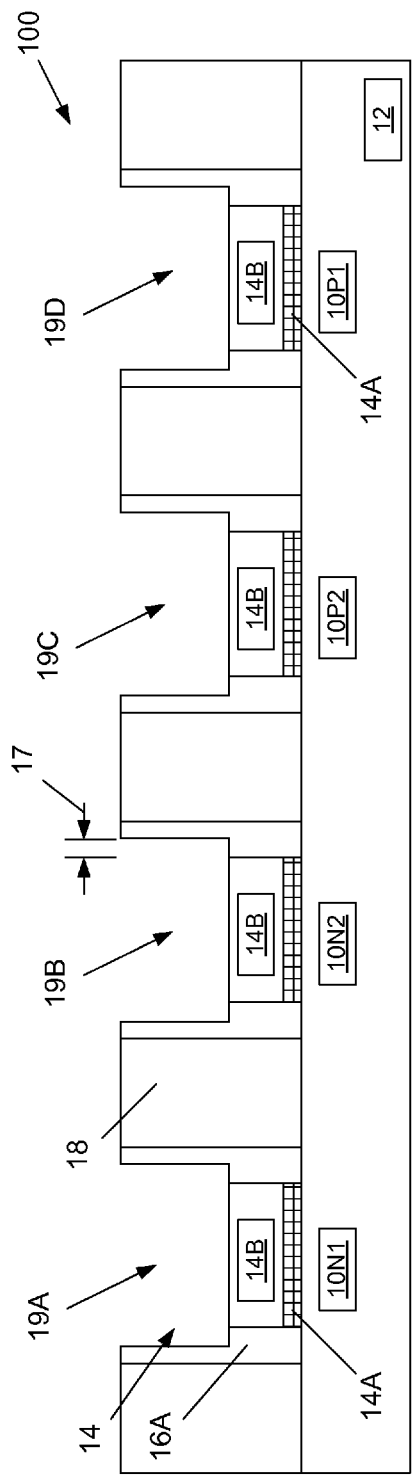
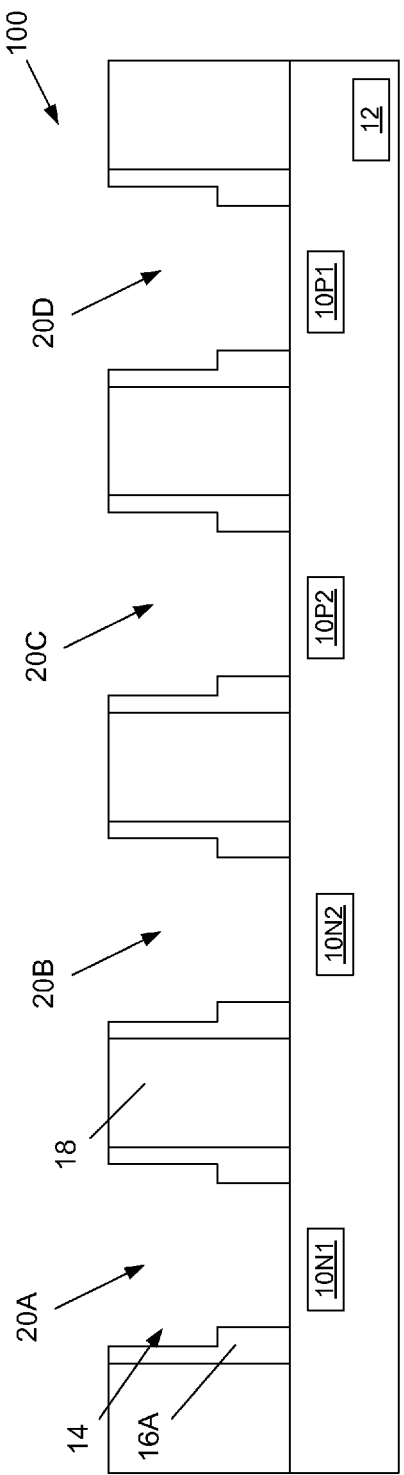

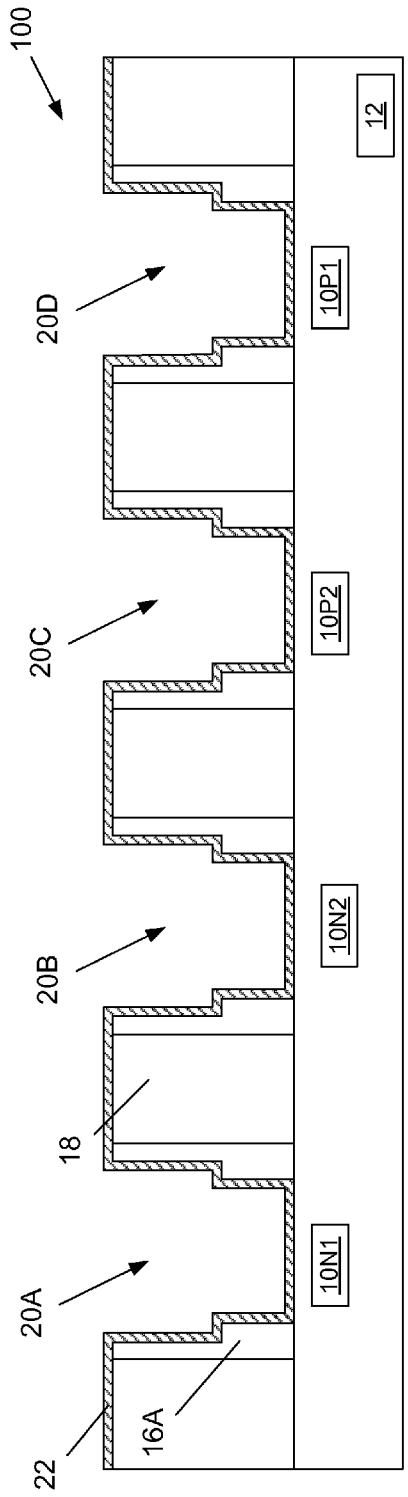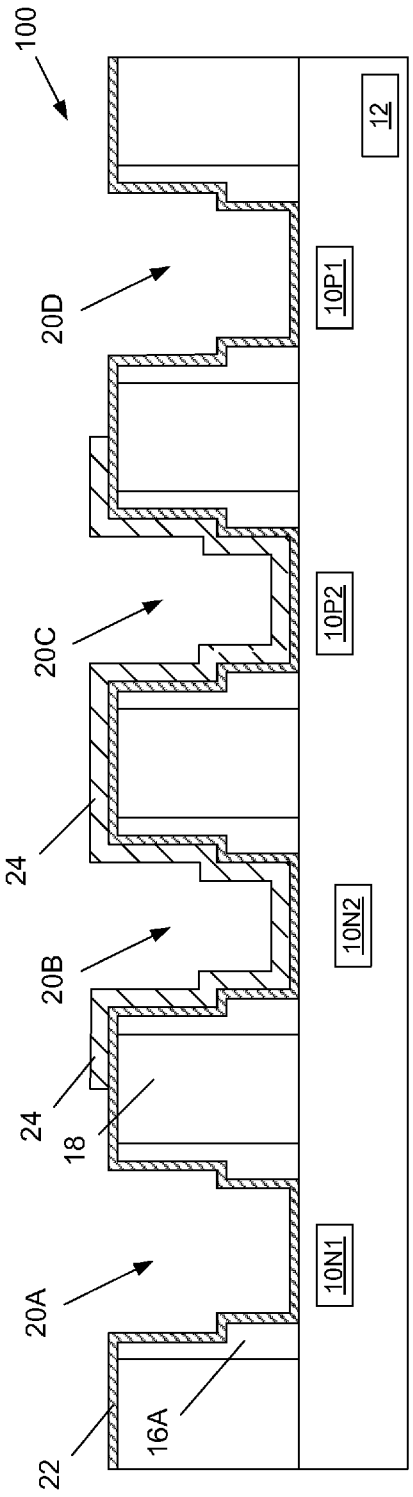
Figure 1E
Figure 1F

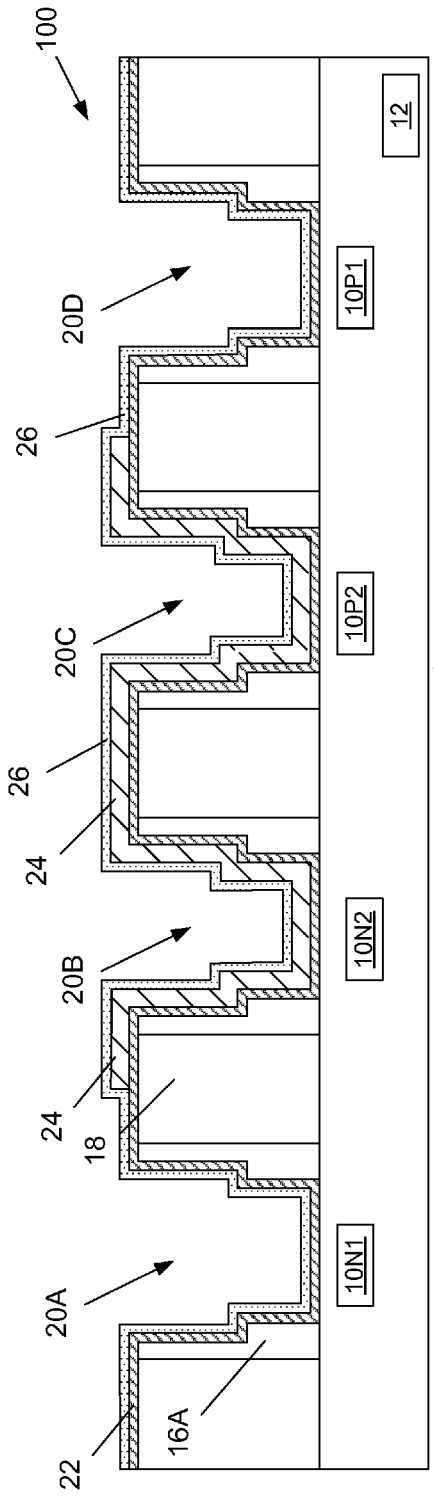
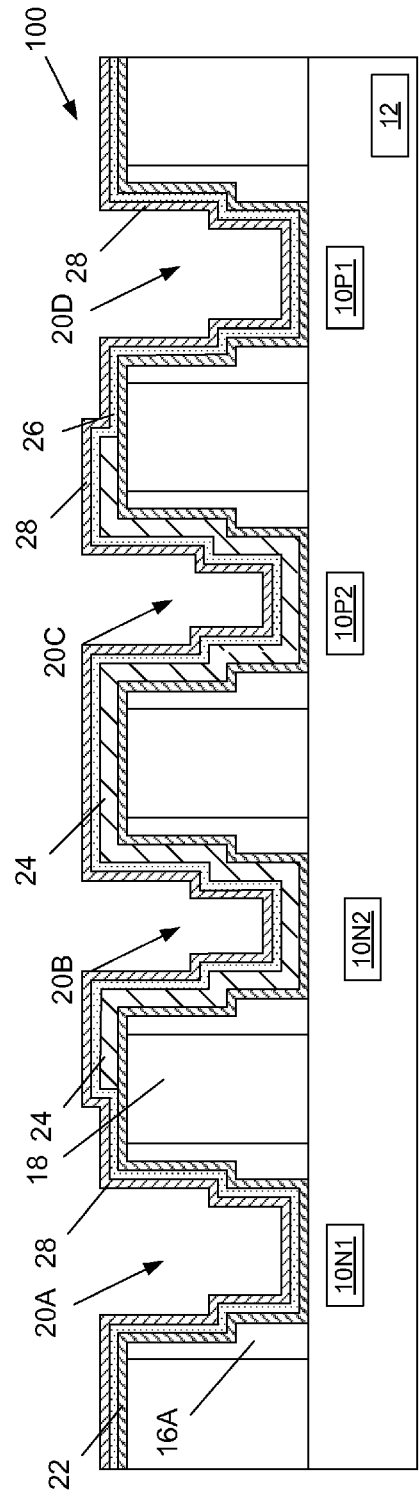

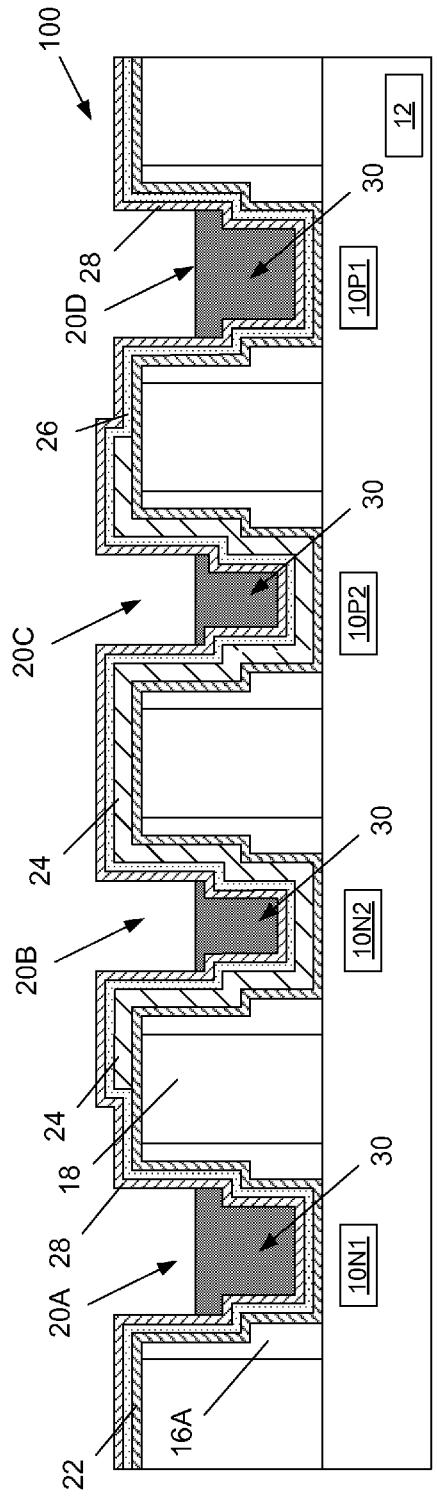
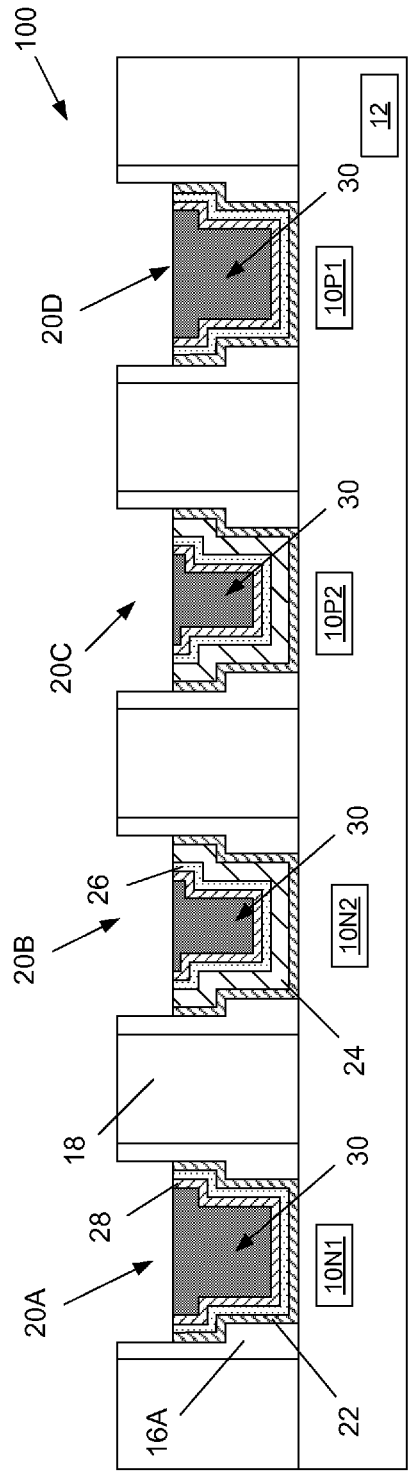
Figure 1I
Figure 1J

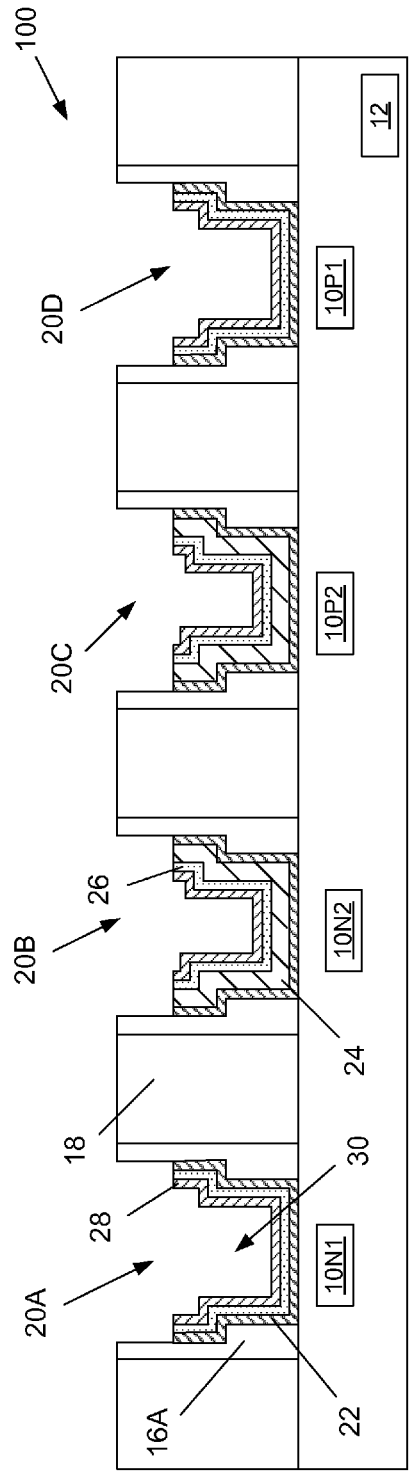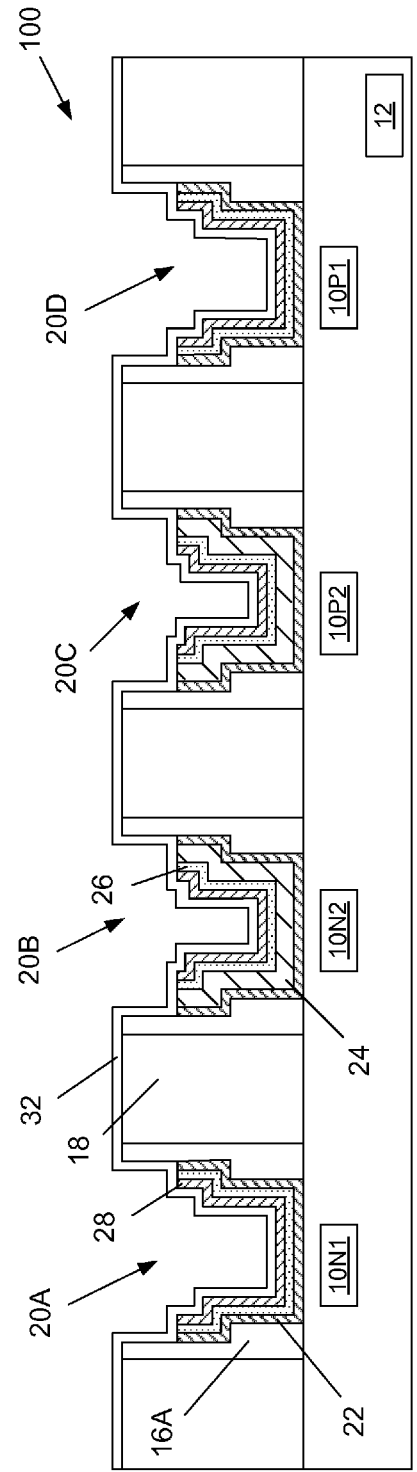

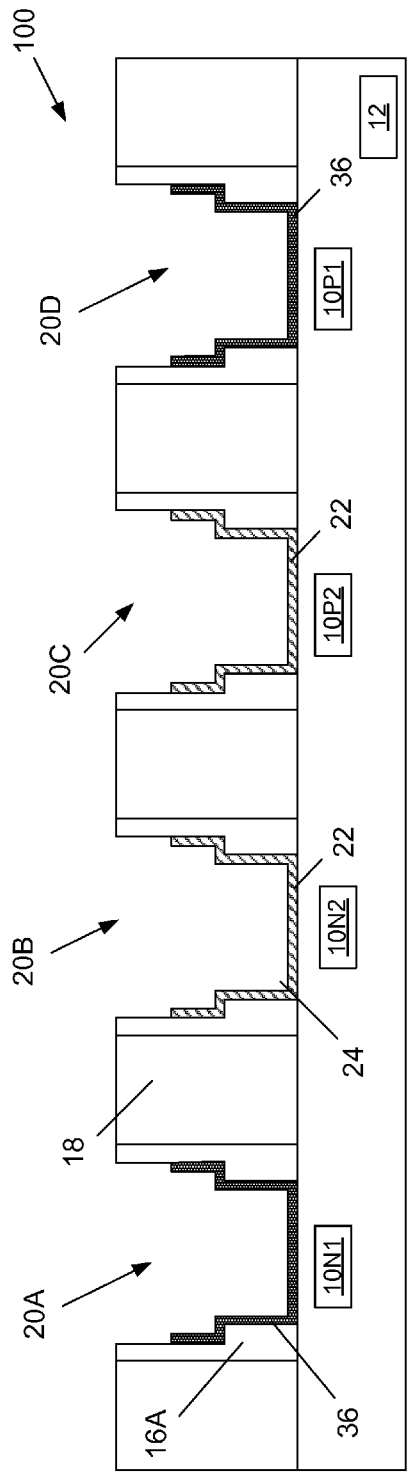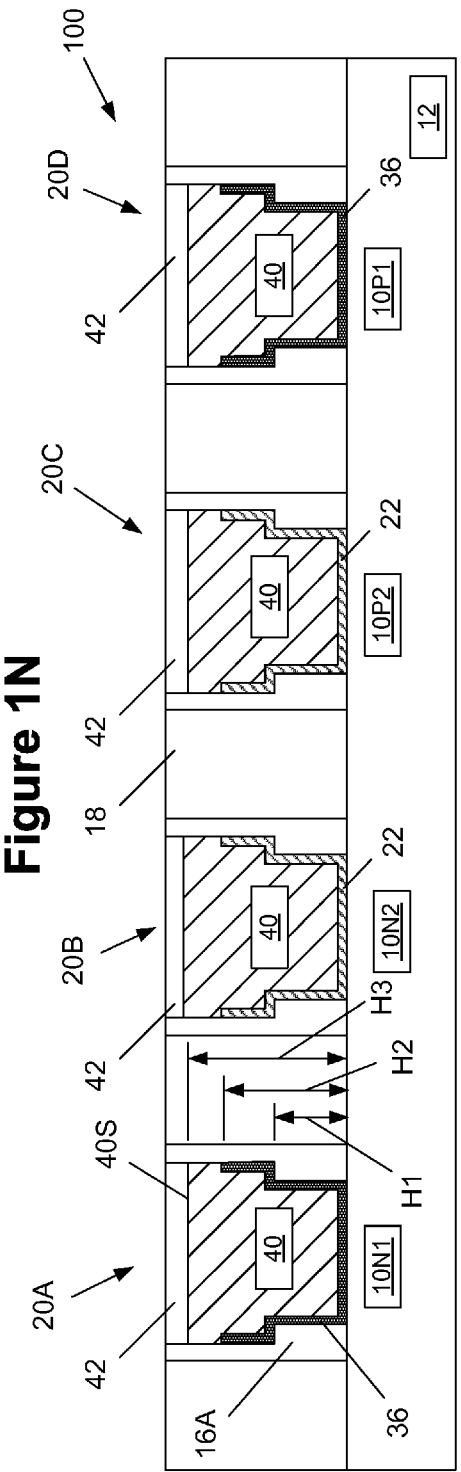

METHODS OF FORMING TRANSISTOR DEVICES WITH DIFFERENT THRESHOLD VOLTAGES AND THE RESULTING PRODUCTS

BACKGROUND OF THE INVENTION

1. Field of the Invention

Generally, the present disclosure relates to the manufacture of semiconductor devices, and, more specifically, to various novel methods of forming transistor devices with different threshold voltage levels and various integrated circuit products containing such transistors.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

For many early device technology generations, the gate structures of most transistor elements (planar and FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer (k-value of approximately 10 or greater) and one or more metal layers that function as the gate electrode have been implemented. Such alternative gate structures—typically known as high-k/metal gate structures (HK/MG structures)—have been shown to provide significantly enhanced operational characteristics over the heretofore more traditional silicon dioxide/polysilicon gate structure configurations.

One well-known processing method that has been used for forming a transistor with a high-k/metal gate structure is the so-called "gate last" or "replacement gate" technique. Generally, the replacement gate process involves: forming a basic transistor structure (planar, FinFET, nanowire, etc.) with a sacrificial gate structure positioned between sidewall spacers; forming the source/drain regions for the device; performing the necessary anneal process to activate implanted dopant materials; removing the sacrificial gate structure so as to define a gate cavity for the replacement gate structure between the spacers; depositing a high-k gate insulation layer and a plurality of metal layers in the gate cavity; performing a CMP process to remove excess materials positioned outside of the gate cavity; recessing the gate materials within the gate cavity to make room for a gate cap layer; and forming a gate cap layer in the gate cavity above the recessed gate materials. However, as the gate length of transistor devices has decreased, the physical size of the gate cavity has also decreased. Thus, it is becoming physically difficult to fit all of the layers of material needed for an HK/MG replacement gate structure within such reduced-size gate cavities, particularly for NMOS devices, due to the greater number of layers of material that are typically used to form the HK/MG structures for the NMOS devices as compared to PMOS devices. For example, as gate lengths continue to decrease, voids or seams may be formed as the various layers of material are deposited into the gate cavity. That is, as the layers of material for the replacement gate are formed in the gate cavity, the remaining space within the gate cavity becomes very small. As the later metal layers are formed, the remaining space within the gate cavity may be only about 1-2 nm in width or even smaller. In some cases, there may be essentially no remaining space in the gate cavity. This may lead to so-called "pinch-off" of metal layers such that voids or seams may be formed in the overall replacement gate structure, which may result in devices that perform at levels less than anticipated or, in some cases, the formation of devices that are simply not acceptable and have to be discarded.

In manufacturing modern integrated circuit products, transistor devices are sometimes intentionally formed so as to exhibit different threshold voltage levels. In general, a transistor having a relatively lower threshold voltage will operate at a higher switching speed than that of a corresponding transistor with a relatively higher threshold voltage level. Such "low-$V_t$" (LVT) transistor devices are typically employed in portions of an integrated circuit product where device performance or speed is desirable or critical, e.g., in the logic circuits of an integrated circuit product. Unfortunately, such low-$V_t$ devices tend to exhibit more off-state leakage currents, which means that they consume more power than would otherwise be desired. Thus, all other things being equal, such low-$V_t$ devices are poor choices in applications where reduced power consumption is important, e.g., mobile computing applications, cell phone applications, etc. The opposite is true for so-called "high-$V_t$" (HVT) transistor devices—they tend to operate at slower switching speeds (a negative) but the off-state leakage currents of such high-$V_t$ devices is less than that of the low-$V_t$ devices (a positive). Such high-$V_t$ devices are typically employed in portions of an integrated circuit product where device performance or speed is less critical, e.g., SRAM circuits. Device designers can also make so-called "regular-$V_t$" (RVT) transistor devices that have a threshold voltage level that is intermediate to that of the low-$V_t$ devices and the high-$V_t$ devices. Of course, the absolute value of these threshold voltage levels (low, regular and high) may vary depending upon a variety of factors.

Device designers have employed several techniques to intentionally change the threshold voltage levels of transistor devices. One technique simply involves changing the gate length—the distance between the source region and the drain region—of the transistor. All other things being equal, a transistor with a shorter gate length will operate at faster speeds, but it will exhibit higher off-state leakage currents than a corresponding transistor having a larger channel length. Device dimensions have decreased to the point where gate lengths are so small that manufacturing devices with ever smaller gate lengths is very challenging, time-consuming and expensive. Thus, adjusting threshold voltage levels by continuing to reduce the channel length of the transistor devices is becoming more problematic.

Another technique that device designers have used to vary the threshold voltage of transistors involved varying the amount of dopant material used in forming the wells in which the transistors were formed. All other things being equal, the greater the dopant concentration in a well region, the greater will be the threshold voltage of the resulting transistor, and vice-versa. However, in some applications, such as forming FinFET devices, it is very challenging to get the appropriate doping levels, due to random dopant fluctuations and the normal Gaussian distribution of ion implantation processes in general.

Yet another technique that device designers have used to form transistor devices with differing threshold voltage levels simply involves making gate stacks of different materials having different work function values so as to ultimately achieve the desired variation in the threshold voltage levels of the devices. The term "work function" (WF) is commonly used in the art of semiconductor design and manufacturing to refer to the minimum energy needed to remove an electron from the surface of a metal. The work function of a metal is typically a constant characteristic of that metal material and it is usually measured in electron-volts (eV). In general, in CMOS integration schemes using a silicon substrate, a work function metal having a work function near the conduction band edge of silicon (about 4.0 eV) is necessary for NMOS type devices, while a different work function metal having a work function near the valance band edge of silicon (about 5.1-5.2 eV) is necessary for PMOS devices. Thus, in CMOS integration schemes employing high-k gate dielectric materials, at least two types of gate stacks are needed, i.e., a stack of suitable materials that satisfies the individual work function requirements for the PMOS devices and a different stack of materials that satisfies the individual work function requirements for the NMOS devices. As noted above, the gate stack for the PMOS devices provides a flat band voltage closer to the valence band edge of the material of the channel of the PMOS devices, and the gate stack for the NMOS devices provides a flat band voltage closer to the conduction band edge of the material of the channel of the NMOS devices. As is readily apparent, the above-mentioned layer stacking process can become quite unwieldy and complex as more and more versions of transistor devices with different threshold voltage levels are fabricated. Among other problems, etching of metals tends to be more difficult and the different physical heights of the gate stacks of the various devices can cause problems during subsequent processing operations.

Yet another technique involves forming a high-k gate insulation layer (e.g., hafnium oxide) in the replacement gate cavities for each of the various devices; forming a patterned protective metal layer on the high-k gate insulation layer that covers the high-k gate insulation layer in some of the devices while leaving the high-k gate insulation layer exposed in other devices; forming a threshold voltage ($V_t$) shifting oxide material (e.g., lanthanum oxide) on the exposed portions of the high k insulation layer and on the patterned protective metal layer; forming a metal capping layer above the $V_t$-shifting oxide material; forming a blanket layer of amorphous silicon above the metal capping layer; and performing a heat treatment to drive material from the $V_t$-shifting oxide material, such as lanthanum, into the contacted high-k gate insulation layer that is contacted by the $V_t$-shifting oxide material. In the case where the high-k gate insulation material is hafnium oxide, this process converts the hafnium oxide to hafnium-lanthanum-oxide. The $V_t$-shifting oxide material, the metal capping layer and the patterned protective metal layer are then removed, and the replacement gate structure is completed by forming additional materials in the gate cavity as previously described. In general, the introduction of lanthanum decreases the threshold voltage level of NMOS devices but increases the threshold voltage level of PMOS devices. In this manner, the threshold voltage levels of the various NMOS and PMOS devices may be adjusted on an integrated circuit product.

Unfortunately, as mentioned above, as the width of the gate cavity has become much smaller, forming the additional materials in the gate cavities to modify the threshold voltages of the devices using a $V_t$-shifting oxide material, as described above, is becoming even more difficult. The present disclosure is directed to novel methods of forming transistor devices with different threshold voltage levels and various integrated circuit products containing such transistors that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming transistor devices with different threshold voltage levels and various integrated circuit products containing such transistors. One illustrative method disclosed herein includes, among other things, forming first and second gate cavities for first and second transistor devices, respectively, the first and second gate cavities being laterally defined by sidewall spacers, forming a high-k oxide gate insulation layer in the first and second gate cavities, forming a conformal patterned masking layer that covers the high-k gate insulation layer in the second gate cavity while exposing the high-k gate insulation layer in the first gate cavity, forming a metal oxide material layer on the high-k oxide gate insulation layer in the first gate cavity and on the conformal patterned masking layer that is positioned within second gate cavity, performing at least one recess etching process such that a first portion of the high-k oxide gate insulation layer and a first portion of the metal oxide layer is positioned entirely within the first gate cavity and a second portion of the high-k oxide gate insulation layer, the conformal patterned masking layer and a second portion of the metal oxide layer is positioned entirely within the second gate cavity, forming a conformal capping layer above materials within the first and second gate cavities, performing at least one heating process to drive metal material from the metal oxide layer into the first portion of the high-k oxide gate insulation layer in the first cavity to thereby form a composite metal-high-k oxide alloy gate insulation layer in the first gate cavity, while preventing metal from the metal oxide material from being driven into the second portion of the high-k oxide gate insulation layer in the second gate cavity during the at least one heating process, removing the conformal capping layer, removing at least the conformal patterned masking layer from within the second gate cavity, and performing at least one process operation to form a first gate electrode structure above the composite metal-high-k oxide alloy gate insulation layer in the first gate cavity and a second gate electrode structure above the high-k oxide gate insulation layer in the second gate cavity.

Yet another illustrative method disclosed herein includes, among other things, forming first, second, third and fourth gate cavities for first, second, third and fourth transistor devices, forming a high-k oxide gate insulation layer in the first, second, third and fourth gate cavities for the first, second, third and fourth transistor devices, forming a conformal patterned masking layer that covers the high-k oxide gate insulation layer in the second and third gate cavities while exposing the high-k oxide gate insulation layer in the first and fourth gate cavities, forming a metal oxide material layer on the high-k oxide gate insulation layer in the first and fourth gate cavities and on the conformal patterned masking layer that is positioned within the second and third gate cavities, performing at least one recess etching process such that first and fourth portions of the high-k oxide gate insulation layer and first and fourth portions of the metal oxide layer are positioned entirely within the first and fourth gate cavities, respectively, while second and third portions of the high-k oxide gate insulation layer, first and second portions of the conformal patterned masking layer and second and third portions of the metal oxide layer are positioned entirely within the second and third gate cavities, respectively, forming a conformal capping layer above materials within the first, second, third and fourth gate cavities, performing at least one heating process to drive metal material from the metal oxide layer into the first and fourth portions of the high-k oxide gate insulation layer in the first and fourth gate cavities to thereby form first and second composite metal-high-k oxide alloy gate insulation layers in the first and fourth gate cavities, respectively, while preventing metal from the metal oxide material layer from being driven into the second and third portions of the high-k oxide gate insulation layer in the second and third gate cavities, respectively, during the at least one heating process, removing the conformal capping layer, removing at least the first and second portions of the conformal patterned masking layer from within the second and third gate cavities, and performing at least one process operation to form first, second, third and fourth gate electrode structures in the first, second, third and fourth gate cavities.

One example of a novel integrated circuit product disclosed herein includes, among other things, an integrated circuit product comprised of first and second NMOS transistor devices and first and second PMOS transistor devices, wherein the product comprises a first gate structure for the first NMOS transistor device and a second gate structure for the second PMOS transistor device, the first and second gate structures comprising a composite metal-high-k oxide alloy gate insulation layer, and a third gate structure for the second NMOS transistor device and a fourth gate structure for the first PMOS transistor device, the third and the fourth gate structures comprising a high-k oxide gate insulation layer.

BRIEF DESCRIPTION OF THE DRAWINGS

The disclosure may be understood by reference to the following description taken in conjunction with the accompanying drawings, in which like reference numerals identify like elements, and in which.

Figure 1M:
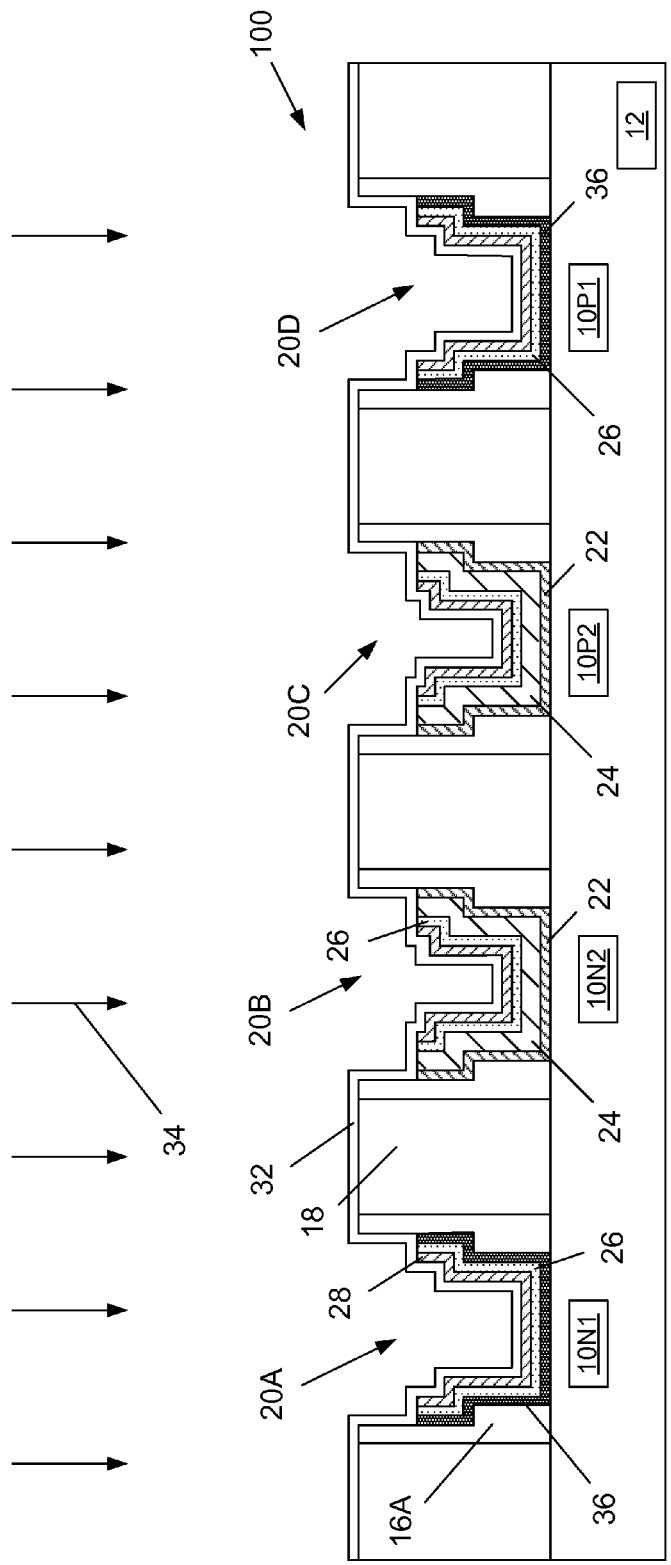
FIGS. 1A-1O depict various illustrative novel methods disclosed herein for forming transistor devices with different threshold voltage levels and various integrated circuit products containing such transistors.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various novel methods of forming transistor devices with different threshold voltage levels and various integrated circuit products containing such transistors. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, the methods and structures disclosed herein may be used when forming any type of transistor device, e.g., planar devices, 3D transistor devices, nanowire devices, etc., or a combination of such devices. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIG. 1A is a simplified, cross-sectional view of an illustrative integrated circuit product 100 at an early stage of manufacturing. A plurality of transistor devices 10N1, 10N2, 10P1 and 10P2 will be formed above a semiconductor substrate 12 using a so-called replacement gate technique. The substrate 12 may have a variety of configurations, such as the depicted bulk silicon configuration. The substrate 12 may also have a silicon-on-insulator (SOI) configuration that includes a bulk silicon layer, a buried insulation layer and an active layer, wherein semiconductor devices are formed in and above the active layer. The substrate 12 may be made of silicon or it may be made of materials other than silicon. Thus, the terms "substrate" or "semiconductor substrate" should be understood to cover all semiconducting materials and all forms of such materials. The cross-sectional view depicted in the attached figures is taken through the gate structure of the devices in a direction that corresponds to the gate length direction of the transistors. So as not to obscure the inventions disclosed herein, isolation regions that are formed in the substrate 12 to define active regions where the transistor devices 10N1, 10N2, 10P1 and 10P2 will be formed are not depicted in the attached drawings. Although the transistor devices 10N1, 10N2, 10P1 and 10P2 are depicted as being formed adjacent one another in the attached drawings, the various transistor devices may be positioned at any desired location on the substrate 12, and the transistor devices 10N1, 10N2, 10P1 and 10P2 may each be formed in separate regions of the substrate 12.

As noted above, in one illustrative embodiment, four illustrative transistor devices 10N1, 10N2, 10P1 and 10P2 will be formed in and above the substrate 12. In this example, each of the transistor devices 10N1, 10N2, 10P1 and 10P2 will be formed so as to have a different threshold voltage ($V_t$) level. In the depicted example, the transistor devices 10N1 and 10N2 are NMOS devices, while the transistors 10P1 and 10P2 are PMOS devices. The NMOS transistor device 10N1 will be formed so as to exhibit a lower threshold voltage ($V_t$) level than the NMOS transistor device 10N2. The PMOS transistor device 10P1 will be formed so as to exhibit a higher threshold voltage ($V_t$) level than the PMOS transistor device 10P2. Thus, for example, the illustrative NMOS transistor device 10N1 and PMOS transistor device 10P2 may be employed in applications where higher performance, e.g., higher switching speeds, is an important design consideration, e.g. N-logic circuits and P-logic circuits, respectively. In contrast, the illustrative NMOS transistor device 10N2 and PMOS transistor device 10P1 may be employed in applications where reduced power consumption, e.g., lower off-state leakage currents, is an important design consideration, e.g., N-based SRAM circuits and P-based SRAM circuits, respectively. By using the methods and devices disclosed herein, device designers will have greater flexibility in designing integrated circuit products 100 that are more tailored to meet the intended application.

With continuing reference to FIG. 1A, the product 100 is depicted at a point in fabrication wherein sacrificial gate structures 14 have been formed above the substrate 12 and any gate cap layers (not shown) that were previously positioned above the sacrificial gate structures 14 have been removed. At this point in the replacement gate process flow, source/drain regions (not shown) would have already been formed in the substrate 12 and an anneal process would have been performed to activate the implanted dopant materials and repair any damage to the substrate 12 due to the various ion implantation processes that were performed. The sacrificial gate structures 14 include a sacrificial gate insulation layer 14A and a dummy or sacrificial gate electrode 14B. Also depicted are illustrative sidewall spacers 16 and a layer of insulating material 18. The various components and structures of the product 100 may be formed using a variety of different materials and by performing a variety of known techniques. For example, the sacrificial gate insulation layer 14A may be comprised of silicon dioxide, the sacrificial gate electrode 14B may be comprised of polysilicon, the sidewall spacers 16 may be comprised of silicon nitride and the layer of insulating material 18 may be comprised of silicon dioxide. As noted above, the layers of material depicted in FIG. 1A, as well as the layers of material described below, may be formed by any of a variety of different known techniques, e.g., a chemical vapor deposition (CVD) process, an atomic layer deposition (ALD) process, physical vapor deposition (PVD), a thermal growth process, etc.

FIG. 1B depicts the integrated circuit product 100 after a timed recess etching process is performed to remove a portion, but not all, of the sacrificial gate electrode 14B. This recess etching process results in the formation of partial or initial replacement gate cavities 19A-D (collectively referred to using the reference number 19). The amount of recessing, or the thickness of the remaining portion of the sacrificial gate electrodes 14B, may vary depending upon the particular application. In one illustrative embodiment, based upon current-day technologies, the post-recessing thickness of the sacrificial gate electrodes 14B may be on the order of about 20-30 nm.

FIG. 1C depicts the integrated circuit product 100 after a timed spacer-trim etch process was performed to reduce a lateral thickness of the upper portion of the spacers 16 while leaving a lateral thickness of the lower portion of the spacers 16 unchanged so as to thereby define a plurality of trimmed sidewall spacers 16A. The vertical height of the trimmed portion of the spacers 16A may vary depending upon the particular application. In one illustrative embodiment, the trimmed portion of the spacers 16 may be at least one-third of the overall height of the spacers 16A. In one illustrative embodiment, the spacer-trim etching process may be an anisotropic etching process. Note, for simplicity, the reduction of height of the trimmed sidewall spacers 16A is not depicted in the attached drawings. In one illustrative embodiment, the spacer-trim etch process may result in the thinning of the spacers by a distance 17 that may fall within the range of about 1-4 nm. In general, by performing the spacer-trim etch process, the overall width of the partial gate cavities 19 (and the final gate cavities) becomes easier to fill with the various layers of material that will be formed to form the final replacement gate structures for the transistor devices.

As shown in FIG. 1D, one or more etching processes are performed through the trimmed spacers 16A to remove the remaining portions of the sacrificial gate electrodes 14B and the sacrificial gate insulation layers 14A to thereby define a plurality of final gate cavities 20A-D (collectively referred to using the reference number 20) wherein replacement gate structures will subsequently be formed for each of the transistor devices 10N1, 10N2, 10P1 and 10P2, respectively. Typically, the sacrificial gate insulation layers 14A are removed as part of the replacement gate technique, as depicted herein. However, the sacrificial gate insulation layers 14A may not be removed in all applications. Even in cases where the sacrificial gate insulation layer 14A is intentionally removed, there will typically be a very thin native oxide layer (not shown) that forms on the substrate 12 within the gate cavities 20A-D.

The next major process operation involves formation of the various layers of material in the gate cavities 20. It should be noted that the lateral width of the gate cavities 20, as well as the thicknesses of the various layers of material that are depicted as being formed in the gate cavities 20, are not to scale so as to facilitate explanation of the present inventions. FIG. 1E depicts the product 100 after several process operations were performed. First, a pre-clean process was performed in an attempt to remove all foreign materials from within the final gate cavities 20A-D prior to forming the various layers of material that will become part of the replacement gate structures. Thereafter, a high-k oxide (k value greater than 10) gate insulation layer 22, such as hafnium oxide, having a thickness of approximately 1-3 nm was initially deposited in the final gate cavities 20A-D by performing a conformal ALD process.

FIG. 1F depicts the product 100 after several process operations were performed so as to ultimately form a conformal patterned sacrificial hard mask 24 above the high-k oxide gate insulation layer 22 in each of the final gate cavities 20B and 20C, while leaving the high-k oxide gate insulation layer 22 within the final gate cavities 20A and 20D exposed. The sacrificial hard mask 24 may be comprised of a variety of different materials, e.g., polysilicon, a metal, etc. In one illustrative embodiment, the sacrificial hard mask 24 may be comprised of a layer of titanium nitride and it may be formed to a thickness of about 1-4 nm. The conformal patterned sacrificial hard mask 24 may be formed by performing a conformal deposition process to form a conformal hard mask material layer on the product 100 in all of the final gate cavities 20A-D, forming a patterned photoresist etch mask (not shown) above the deposited hard mask material layer, and thereafter performing an etching process to remove the desired portions of the deposited hard mask material layer so as to thereby result in the depicted conformal patterned sacrificial hard mask 24. The high-k oxide gate insulation layer 22 may serve as an etch stop during the patterning of the conformal hard mask material layer 24. Thereafter, the patterned photoresist etch mask may be removed so as to arrive at the structure depicted in FIG. 1F.

FIG. 1G depicts the product after a metal oxide material layer 26, i.e., a threshold voltage ($V_t$) shifting oxide material (e.g., lanthanum oxide, aluminum oxide, ytterbium oxide, etc.), was formed on the exposed portions of the high-k oxide gate insulation layer 22 (in gate cavities 20A, 20D) and on the conformal patterned sacrificial hard mask 24 by performing a conformal deposition process, e.g., ALD, PVD, CVD, etc. The thickness of the metal oxide material layer 26 may vary depending upon the particular application, e.g., 1-2 nm.

FIG. 1H depicts the integrated circuit product 100 after a relatively thin conformal capping layer 28 was formed on the metal oxide material layer 26 and in the gate cavities 20 by performing a conformal deposition process. In one illustrative embodiment, the conformal capping layer 28 may be comprised of a metal or a metal alloy, e.g., titanium nitride. The thickness of the conformal capping layer 28 may vary depending upon the particular application, e.g., 1-2 nm.

FIG. 1I depicts the integrated circuit product 100 after a sacrificial etch-protection layer 30 was formed so as to partially fill the gate cavities 20. In one illustrative embodiment, the sacrificial etch-protection layer 30 may be comprised of a material such as OPL that may be initially formed across the product 100 by performing a spin-coating process. The recessed sacrificial etch-protection layer 30 depicted in FIG. 1I may be formed by initially forming the sacrificial etch-protection layer across the product 100 so as to overfill the cavities 20, and thereafter performing a timed, recess-etching process to remove the desired amount of the etch-protection material so as to thereby result in the recessed sacrificial etch-protection layer 30 as depicted in the drawings. The thickness of the recessed sacrificial etch-protection layer 30 may vary depending upon the particular application. Note that, due to the formation of the trimmed spacers 16A, and the resulting widening of the openings of the gate cavities 20, it is much more likely that the etch-protection material formed in at least the upper portion of the gate cavities 20 will be substantially void-free.

FIG. 1J depicts the integrated circuit product 100 after several selective etching processes were performed to remove the portions of layers of material 22, 24, 26 and 28 not protected by the recessed sacrificial etch-protection layer 30 from within the gate cavities 20. In one illustrative embodiment, these selective etching processes may be wet etching processes. During the removal of the conformal capping layer 28, the metal oxide material layer 26 serves as an etch stop layer. During the removal of the metal oxide material layer 26, the high-k oxide gate insulation layer 22 (cavities 20A, 20D) and the sacrificial hard mask 24 (cavities 20B, 20C) serve as etch stop layers. Importantly, the presence of the high-k oxide gate insulation layer 22 and the sacrificial hard mask 24 protect the trimmed sidewall spacers 16A and the layer of insulating material 18 from attack during this etching process. Thereafter, the conformal patterned hard mask 24 is selectively removed relative to the high-k oxide gate insulation layer 22, wherein the presence of the high-k oxide gate insulation layer 22 serves to protect the trimmed sidewall spacers 16A and the layer of insulating material 18 from attack during this etching process. Finally, the exposed portions of the high-k oxide gate insulation layer 22 are selectively removed relative to the layer of insulating material 18, the trimmed sidewall spacers 16A and the recessed sacrificial etch-protection layer 30, so as to result in the structure depicted in FIG. 1J.

FIG. 1K depicts the integrated circuit product 100 after an etching or rinsing process was performed to remove the recessed sacrificial etch-protection layer 30 selectively relative to the surrounding materials.

FIG. 1L depicts the integrated circuit product 100 after a relatively thin, conformal capping layer 32, e.g., a layer of amorphous silicon, was formed across the product and in the gate cavities 20 by performing a conformal deposition process. The thickness of the conformal capping layer 32 may vary depending upon the particular application, e.g., 4-7 nm. As will be appreciated by those skilled in the art after a complete reading of the present application, the conformal capping layer 32 of amorphous silicon is formed so as to prevent oxidation of the high-k stack. However, without the removal of the upper portions of the layers 22, 24, 26 and 28, there is a very high likelihood that the capping layer 32 would simply pinch-off the gate cavities 20 due to the very small size of the gate cavities 20. Once amorphous silicon is pinched off within the gate cavities 20, it is very difficult to remove substantially all of the amorphous silicon. Attempts to remove such pinched-off amorphous silicon involves the use of very aggressive cleaning materials, which tend to damage the high-k gate insulation material. On the other hand, using milder, less aggressive cleaning materials so as to not damage the high-k gate insulation material, typically results in incomplete removal of the amorphous silicon.

FIG. 1M depicts the integrated circuit product 100 after an anneal process 34 was performed to drive-in or intermix some of the metal material, e.g., lanthanum, aluminum, ytterbium, etc., in the metal oxide material layer 26 with the portions of the high-k oxide gate insulation layer 22 that it physically contacts. This process results in forming a plurality of composite metal-high-k oxide alloy gate insulation layers 36 in the cavities 20A, 20D, while the original high-k oxide gate insulation material 22 remains in the gate cavities 20B, 20C. That is, the layers 36 are composite metal, high-k oxide alloy gate insulation layers while the layers 22 are simply high-k oxide gate insulation layers. Stated another way, by use of the term "composite metal, high-k oxide alloy gate insulation layer" here and in the claims, it is meant that the composite metal, high-k oxide alloy gate insulation layer 36 has a significantly higher concentration (at least 0.1% greater) of the metal from the metal oxide material layer 26 than is present in the original, high-k oxide gate insulation layer 22. In general, when the devices are completed, the introduction of the metal material from the metal oxide material layer 26 into the material of the original high-k oxide gate insulation layer 22 so as to thereby form the composite metal, high-k oxide alloy gate insulation layers 36 has the effect of lowering the threshold voltage of the NMOS devices and increasing the threshold voltage of the PMOS devices. Due to the presence of the remaining portions of the sacrificial conformal hard mask 24 within the gate cavities 20B, 20C, which separates the high-k oxide gate insulation layer 22 and the metal oxide material layer 26, the high-k oxide gate insulation layers 22 in the gate cavities 20B, 20C remain substantially unchanged. As noted above, the metal oxide material layer 26 may be comprised of different materials. For example, in the case where the high-k oxide gate insulation layer 22 is comprised of hafnium oxide and the metal oxide material layer 26 is comprised of lanthanum oxide, the composite metal-high-k oxide alloy gate insulation layer 36 may be comprised of hafnium-lanthanum oxide ($HfLa_xO_y$). In the case where the high-k oxide gate insulation layer 22 is comprised of hafnium oxide and the metal oxide material layer 26 is comprised of aluminum oxide, the composite metal-high-k oxide alloy gate insulation layer 36 may be comprised of hafnium-aluminum oxide ($HfAl_xO_y$). In the case where the high-k oxide gate insulation layer 22 is comprised of hafnium oxide and the metal oxide material layer 26 is comprised of ytterbium oxide, the composite metal-high-k oxide alloy gate insulation layer 36 may be comprised of hafnium-ytterbium oxide ($HfYb_xO_y$).

In the depicted example, the anneal process 34 is performed for such a duration that the entire thickness of the original high-k oxide gate insulation layer 22 positioned in the gate cavities 20A, 20D is intermixed with the metal material in the metal oxide material layer 26, while such intermixing does not occur in the high-k oxide gate insulation layer in the gate cavities 20B, 20C. In one example, the drive-in anneal process 34 may be performed at a temperature that falls within the range of about 500-1200° C. for a duration of a few nanoseconds up to about 1-10 seconds. The type of anneal process that is performed may vary depending upon the particular application, e.g., a spike anneal, a laser anneal, an RTA process, etc. In some embodiments, the drive-in anneal process 34 described above may be performed as part of or in addition to a so-called reliability anneal process that is typically performed to increase the reliability of the high-k oxide gate insulation layers 22.

FIG. 1N depicts the product 100 after one or more etching processes have been performed to remove all materials within the gate cavities 20 except the remaining portions of the high-k oxide gate insulation layer 22 (in the gate cavities 20B and 20C) and the composite metal-high-k oxide alloy gate insulation layer 36 (in the gate cavities 20A and 20D). In one illustrative embodiment, these selective etching processes may be wet etching processes.

FIG. 1O depicts the device 100 after illustrative and schematically depicted conductive gate structures 40 and non-conductive gate cap layers 42 were formed for the devices in the gate cavities 20 using well-known replacement-gate manufacturing techniques, such as those briefly outlined in the background section of this application. As depicted, the transistor devices 10N1 and 10P1 include the composite metal-high-k oxide alloy gate insulation layer 36, while the devices 10N2, 10P2 include the original high-k oxide gate insulation layers 22. In one illustrative embodiment, the schematically depicted conductive gate structures 40 may be comprised of polysilicon or one or more metal layers that act as the gate electrode. As will be recognized by those skilled in the art after a complete reading of the present application, the conductive gate structures 40 of the transistor devices are intended to be representative in nature. Of course, the materials of construction of the conductive gate structures 40 for the various NMOS and PMOS devices may be different. The gate cap layer 42 may be comprised of a material such as silicon nitride.

With continuing reference to FIG. 1O, other aspects of the novel devices will be further described. Using the methods disclosed herein, the gate structures 40 may have a unique configuration. Three different height levels (H1-H3) relative to a common horizontal reference surface, such as the upper surface of the substrate 12, are identified in FIG. 1O. The height level H1 reflects the height level of the interface between the untrimmed bottom portion and the trimmed upper portion of the trimmed spacers 16A, the height level H2 reflects the height level of the uppermost surfaces of the recessed composite metal-high-k oxide alloy gate insulation layer 36 or the recessed high-k oxide gate insulation layer 22 (depending upon the device under consideration), and the height level H3 reflects the height level of the substantially planar upper surface 40S of the conductive gate electrode materials, e.g., such as tungsten, after the gate electrode materials have been recessed to make room within the gate cavities for the gate cap layers 42. In one embodiment, the dimension H1 is less than H2 and H2 is less than H3. In another embodiment the dimension H3 may be less than the dimension H2. In one particular embodiment, the value of H1 may be about 10-30 nm, the value of H2 may be about 15-50 nm and the value of H3 may be about 30-70 nm. The dimension H1 reflects that the upper portion of the original spacers 16 was trimmed to thereby define the trimmed spacers 16A, which define a wider opening for the gate cavities, thereby insuring more reliable filling of materials in the gate cavities 20. The dimension H2 reflects that the original high-k oxide layer 22 was recessed within the gate cavities. The fact that H2 is greater than H1 means that the recessing of the original high-k oxide layer 22 within the gate cavities is more reliable. The fact that H3 is greater than or less than H2 is reflective of the fact that the recessing of the original high-k oxide layer 22 within the gate cavities was not performed as part of the traditional recessing of the gate materials, e.g., tungsten recessing, so as to make room for the cap layers 42 within the gate cavities 20.

At the point of fabrication depicted in FIG. 1O, traditional manufacturing techniques may be performed to complete the manufacture of the integrated circuit product 100. For example, additional contacts and metallization layers may be formed above the product 100 using traditional techniques.

Using the methods disclosed herein, the transistor devices 10N1, 10N2, 10P1 and 10P2 may be formed with different threshold voltage levels. More specifically, in the depicted example, the methods disclosed herein result in reducing the threshold voltage of the NMOS transistor device 10N1 and increasing the threshold voltage of the PMOS transistor device 10P1. The magnitude in change in the threshold voltages of these devices, with the composite metal-high-k oxide alloy gate insulation layer 36, as compared to a corresponding device having the untreated high-k oxide gate insulation layer 22, may vary depending upon the particular application. In one illustrative embodiment, using the methods disclosed herein, the threshold voltage level of the NMOS transistor device 10N1 with a composite metal-high-k oxide alloy gate insulation layer 36 may be reduced by about 10-300 mV relative to a corresponding NMOS device having the untreated high-k gate insulation layer 22. Additionally, in one illustrative embodiment, using the methods disclosed herein, the threshold voltage level of the PMOS transistor device 10P1 with a composite metal-high-k oxide alloy gate insulation layer 36 may be increased by about 10-300 mV relative to a corresponding PMOS device having the untreated high-k oxide gate insulation layer 22. As will be appreciated by those skilled in the art, the methods disclosed herein need not be employed on both the NMOS and PMOS devices in all applications, although that can be the case in some CMOS applications. That is, in some CMOS applications, only the NMOS devices may be selectively processed as disclosed herein, while the PMOS devices are processed the same, i.e., the threshold voltage level of the NMOS device 10N1 may be reduced using the methods disclosed herein, while the threshold voltage levels of the PMOS devices 10P1 and 10P2 are approximately the same. In other CMOS applications, only the PMOS devices may be selectively processed as disclosed herein, while the NMOS devices are processed the same, i.e., the threshold voltage level of the PMOS device 10P1 may be increased using the methods disclosed herein, while the threshold voltage levels of the NMOS devices 10N1 and 10N2 are approximately the same. In yet other embodiments, the method disclosed herein may be performed on products where only NMOS devices are fabricated and/or on products where only PMOS devices are fabricated. Providing device designers with techniques to manufacture multiple-$V_t$ devices gives designers increased flexibility as it relates to designing ever more complex and sophisticated integrated circuit products.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming replacement gate structures for first and second transistor devices, comprising:
    performing at least one etching process to remove sacrificial gate structures for said first and second transistor devices to thereby define first and second gate cavities for said first and second transistor devices, respectively, said first and second gate cavities being laterally defined by sidewall spacers;
    forming a high-k oxide gate insulation layer in said first and second gate cavities;
    forming a conformal patterned masking layer that covers said high-k oxide gate insulation layer in said second gate cavity while exposing said high-k oxide gate insulation layer in said first gate cavity;
    forming a metal oxide material layer on said high-k oxide gate insulation layer in said first gate cavity and on said conformal patterned masking layer that is positioned within said second gate cavity;
    performing at least one recess etching process such that a first portion of said high-k oxide gate insulation layer and a first portion of said metal oxide layer is positioned entirely within said first gate cavity and a second portion of said high-k oxide gate insulation layer, said conformal patterned masking layer and a second portion of said metal oxide layer is positioned entirely within said second gate cavity;
    forming a conformal capping layer above materials within said first and second gate cavities;
    performing at least one heating process to drive metal material from said metal oxide layer into said first portion of said high-k oxide gate insulation layer in said first cavity to thereby form a composite metal-high-k oxide alloy gate insulation layer in said first gate cavity, while preventing metal from said metal oxide material from being driven into said second portion of said high-k oxide gate insulation layer in said second gate cavity during said at least one heating process;
    removing said conformal capping layer;
    removing at least said conformal patterned masking layer from within said second gate cavity; and
    performing at least one process operation to form a first gate electrode structure above said metal-high-k oxide alloy gate insulation layer in said first gate cavity and a second gate electrode structure above said high-k oxide gate insulation layer in said second gate cavity.

2. The method of claim 1, wherein said metal oxide layer is one of lanthanum oxide, aluminum oxide or ytterbium oxide.

3. The method of claim 1, wherein said first and second transistor devices are both NMOS devices and wherein the threshold voltage of said first transistor is less than the threshold voltage of said second transistor.

4. The method of claim 1, wherein said first and second transistor devices are both PMOS devices and wherein the threshold voltage of said first transistor is greater than the threshold voltage of said second transistor.

5. The method of claim 1, wherein said first transistor device is an NMOS device and said second transistor device is a PMOS device.

6. The method of claim 1, wherein said first transistor device is a PMOS device and said second transistor device is an NMOS device.

7. The method of claim 1, wherein performing said at least one heating process comprises performing said at least one heating process at a temperatures that falls within the range of 500-1200° C. for a duration of 3 seconds or less.

8. The method of claim 1, wherein, prior to forming said high-k oxide gate insulation layer in said first and second gate cavities, the method further comprises performing a spacer trim etching process to reduce a lateral thickness of an upper portion of said sidewall spacers while leaving a lateral thickness of a lower bottom portion of said sidewall spacers unchanged.

9. The method of claim 1, wherein said metal oxide layer is a layer of lanthanum oxide, said high-k oxide gate insulation layer is a layer of hafnium oxide and said composite metal-high-k oxide alloy gate insulation layer in said first gate cavity is a layer of hafnium-lanthanum oxide ($HfLa_xO_y$).

10. The method of claim 1, wherein said metal oxide layer is a layer of aluminum oxide, said high-k oxide gate insulation layer is a layer of hafnium oxide and said composite metal-high-k oxide alloy gate insulation layer in said first gate cavity is a layer of hafnium-aluminum oxide ($HfAl_xO_y$).

11. The method of claim 1, wherein said metal oxide layer is a layer of ytterbium oxide, said high-k oxide gate insulation layer is a layer of hafnium oxide and said composite metal-high-k oxide alloy gate insulation layer in said first gate cavity is a layer of hafnium-ytterbium oxide ($HfYb_xO_y$).

12. The method of claim 1, wherein said conformal capping layer is made of amorphous silicon.

13. A method of forming replacement gate structures for first and second NMOS transistor devices and third and fourth PMOS transistor devices, comprising:
performing at least one etching process to remove sacrificial gate structures for said first, second, third and fourth transistor devices to thereby define first, second third and fourth gate cavities for said first, second, third and fourth transistor devices, respectively, said first, second, third and fourth gate cavities being laterally defined by sidewall spacers;
forming a high-k oxide gate insulation layer in said first, second, third and fourth gate cavities for said first, second, third and fourth transistor devices;
forming a conformal patterned masking layer that covers said high-k oxide gate insulation layer in said second and third gate cavities while exposing said high-k oxide gate insulation layer in said first and fourth gate cavities;
forming a metal oxide material layer on said high-k oxide gate insulation layer in said first and fourth gate cavities and on said conformal patterned masking layer that is positioned within said second and third gate cavities;
performing at least one recess etching process such that first and fourth portions of said high-k oxide gate insulation layer and first and fourth portions of said metal oxide layer are positioned entirely within said first and fourth gate cavities, respectively, while second and third portions of said high-k oxide gate insulation layer, first and second portions of said conformal patterned masking layer and second and third portions of said metal oxide layer are positioned entirely within said second and third gate cavities, resprectively;
forming a conformal capping layer above materials within said first, second, third and fourth gate cavities;
performing at least one heating process to drive metal material from said metal oxide layer into said first and fourth portions of said high-k oxide gate insulation layer in said first and fourth gate cavities to thereby form first and second composite metal-high-k oxide alloy gate insulation layers in said first and fourth gate cavities, respectively, while preventing metal from said metal oxide material layer from being driven into said second and third portions of said high-k oxide gate insulation layer in said second and third gate cavities, respectively, during said at least one heating process;
removing said conformal capping layer;
removing at least said first and second portions of said conformal patterned masking layer from within said second and third gate cavities; and
performing at least one process operation to form first, second, third and fourth gate electrode structures in said first, second, third and fourth gate cavities.

14. The method of claim 13, wherein said metal oxide layer is one of lanthanum oxide, aluminum oxide or ytterbium oxide.

15. The method of claim 13, wherein said first and second transistor devices are NMOS devices and said third and fourth transistor devices are PMOS devices, wherein a threshold voltage of said first transistor is less than the threshold voltage of said second transistor and a threshold voltage of said fourth transistor is greater than the threshold voltage of said third transistor device.

16. The method of claim 13, wherein performing said at least one heating process comprises performing said at least one heating process at a temperatures that falls within the range of 500-1200° C. for a duration of 3 seconds or less.

17. The method of claim 13, wherein, prior to forming said high-k oxide gate insulation layer in said first, second, third and fourth cavities, the method further comprises performing a spacer trim etching process to reduce a lateral thickness of an upper portion of said sidewall spacers while leaving a lateral thickness of a lower bottom portion of said sidewall spacers unchanged.

18. The method of claim 13, wherein said metal oxide layer is a layer of lanthanum oxide, said high-k oxide gate insulation layer is a layer of hafnium oxide and said composite metal-high-k oxide alloy gate insulation layer in said first gate cavity is a layer of hafnium-lanthanum oxide ($HfLa_xO_y$).

19. The method of claim 13, wherein said metal oxide layer is a layer of aluminum oxide, said high-k oxide gate insulation layer is a layer of hafnium oxide and said composite metal-high-k oxide alloy gate insulation layer in said first gate cavity is a layer of hafnium-aluminum oxide ($HfAl_xO_y$).

20. The method of claim 13, wherein said metal oxide layer is a layer of ytterbium oxide, said high-k oxide gate insulation layer is a layer of hafnium oxide and said composite metal-high-k oxide alloy gate insulation layer in said first gate cavity is a layer of hafnium-ytterbium oxide ($HfYb_xO_y$).

21. An integrated circuit product comprising first and second NMOS transistor devices and first and second PMOS transistor devices, comprising:
a first gate structure for said first NMOS transistor device and a second gate structure for said second PMOS transistor device, said first and second gate structures comprising a composite metal-high-k oxide alloy gate insulation layer; and
a third gate structure for said second NMOS transistor device and a fourth gate structure for said first PMOS transistor device, said third and fourth gate structures comprising a high-k oxide gate insulation layer.

22. The device of claim 21, wherein said first and third gate structures comprise a first plurality of metal layers and said second and fourth gate structures comprise a second plurality of metal layers, wherein said first and second plurality of metal layers are different.

23. The device of claim 21, wherein said device further comprises sidewall spacers positioned adjacent said first, second, third and fourth gate structures, wherein an upper portion of said sidewall spacers have a lateral thickness that is less than a lateral thickness of a lower portion of said sidewall spacers.

24. The device of claim 21, wherein said high-k oxide gate insulation layer is a layer of hafnium oxide and said composite metal-high-k oxide alloy gate insulation layer is a layer of hafnium-lanthanum oxide ($HfLa_xO_y$).

25. The device of claim 21, wherein said high-k oxide gate insulation layer is a layer of hafnium oxide and said composite metal-high-k oxide alloy gate insulation layer is a layer of hafnium-aluminum oxide ($HfAl_xO_y$).

26. The device of claim 21, wherein said metal oxide layer is a layer of ytterbium oxide, said high-k oxide gate insulation layer is a layer of hafnium oxide and said composite metal-high-k oxide alloy gate insulation layer is a layer of hafnium-ytterbium oxide ($HfYb_xO_y$).

27. The device of claim 21, wherein said first gate structure further comprises a first conductive gate electrode structure and said second gate structure further comprises a second conductive gate electrode structure, wherein each of said first and second conductive gate electrode structures have a substantially planar upper surface that is positioned at a first height level above an upper surface of a semiconductor substrate, and wherein said composite metal-high-k oxide alloy gate insulation layers in said first and second gate structures each have an uppermost surface that is positioned at a second height level above said upper surface of said semiconductor substrate, wherein said first height level is greater than or less than said second height level.

28. The device of claim 27, wherein said first height level is greater than said second height level.

29. The device of claim 27, wherein said device further comprises sidewall spacers positioned adjacent said first and second gate structures, wherein each of said sidewall spacers comprise an upper portion that has a lateral thickness that is less than a lateral thickness of a lower portion of said sidewall spacers, and wherein an interface between said upper and lower portions of said sidewall spacer is positioned at a third height level above said upper surface of said semiconductor substrate, wherein said second height level is greater than said third height level.

\* \* \* \* \*